(12) United States Patent
Gustavsson et al.

(10) Patent No.: US 9,843,345 B2
(45) Date of Patent: *Dec. 12, 2017

(54) TRANSMITTER WITH QUANTIZATION NOISE COMPENSATION

(71) Applicant: Telefonaktiebolaget L M Ericsson (publ), Stockholm (SE)

(72) Inventors: Ulf Gustavsson, Göteborg (SE); Johan Thorebäck, Sundbyberg (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

This patent is subject to a terminal disclaimer.

(21) Appl. No.: 15/017,852

(22) Filed: Feb. 8, 2016

(65) Prior Publication Data
US 2016/0164554 A1 Jun. 9, 2016

Related U.S. Application Data

(63) Continuation of application No. 13/899,757, filed on May 22, 2013, now Pat. No. 9,264,078, which is a
(Continued)

(51) Int. Cl.
*H03F 1/32* (2006.01)
*H04B 1/04* (2006.01)
(Continued)

(52) U.S. Cl.
CPC ......... *H04B 1/0475* (2013.01); *H03F 1/0244* (2013.01); *H03F 1/3241* (2013.01);
(Continued)

(58) Field of Classification Search
CPC ... H04B 1/0475; H03F 1/0244; H03F 1/3241; H03F 1/3247; H03G 3/3042;
(Continued)

(56) References Cited

U.S. PATENT DOCUMENTS 4,972,436 A  11/1990  Halim et al.
6,100,756 A * 8/2000  Wang .................... H03F 1/0222
                                                          330/10
(Continued)

FOREIGN PATENT DOCUMENTS

EP  1492229 A1  12/2001
WO  01/08297 A1  2/2001
(Continued)

OTHER PUBLICATIONS

Asbeck, P. M. et al. "Synergistic Design of DSP and Power Amplifiers for Wireless Communications." IEEE Transactions on Microwave Theory and Techniques, Nov. 2001, pp. 2163-2169, vol. 49, No. 11, IEEE.
(Continued)

*Primary Examiner* — Michelle M Koeth
(74) *Attorney, Agent, or Firm* — Coats & Bennett, PLLC

(57) ABSTRACT

The invention discloses a transmitter comprising a pulse encoder for creating pulses from the amplitude of an input signal to the transmitter, a compensation signal generator for cancelling quantization noise caused by the pulse encoder, a mixer or I/Q modulator for mixing an output of the pulse encoder with the phase of an input signal to the transmitter, said output of the pulse encoder comprising the amplitude of the complex input signal plus the quantization noise caused by the pulse encoder, and an amplifier for creating an output signal from the transmitter. In the transmitter, a control signal ($C_A$) for controlling a function of the amplifier comprises an output signal from the compensation signal generator, and an input signal to the amplifier comprises an output from the mixer having been modulated to a desired frequency.

6 Claims, 5 Drawing Sheets

Related U.S. Application Data continuation of application No. 13/320,372, filed as application No. PCT/SE2009/050552 on May 18, 2009, now Pat. No. 8,472,557.

(51) Int. Cl.
  *H03G 3/30* (2006.01)
  *H03G 11/00* (2006.01)
  *H03F 1/02* (2006.01)
  *H04L 25/49* (2006.01)
  *H04L 27/36* (2006.01)

(52) U.S. Cl.
  CPC ......... *H03F 1/3247* (2013.01); *H03G 3/3042* (2013.01); *H03G 11/002* (2013.01); *H04L 25/49* (2013.01); *H04L 25/4902* (2013.01); *H04L 27/361* (2013.01); *H04L 27/366* (2013.01); *H03C 2200/0058* (2013.01); *H04B 2001/0408* (2013.01); *H04B 2001/0425* (2013.01)

(58) Field of Classification Search
  CPC ... H03G 11/002; H04L 25/49; H04L 25/4902; H04L 27/361; H04L 27/366
  See application file for complete search history.

(56) References Cited

U.S. PATENT DOCUMENTS

| | | | |
|---|---|---|---|
| 8,472,557 | B2 | 6/2013 | Gustavsson et al. |
| 2005/0110562 | A1* | 5/2005 | Robinson .............. H03F 1/0227 330/10 |
| 2006/0111074 | A1 | 5/2006 | Petilli et al. |
| 2006/0208794 | A1* | 9/2006 | Morishima ............. H03F 3/217 330/10 |
| 2008/0068240 | A1* | 3/2008 | Matsuura ................ H03M 3/51 341/143 |
| 2008/0258831 | A1 | 10/2008 | Kunihiro et al. |
| 2009/0273396 | A1* | 11/2009 | Nam ....................... H03F 3/217 330/10 |

FOREIGN PATENT DOCUMENTS

| | | |
|---|---|---|
| WO | 2006/110590 A1 | 10/2006 |
| WO | 2007080741 A1 | 7/2007 |

OTHER PUBLICATIONS

Zhang, X. et al. "Gain and Phase Error-Free LINC Transmitter." IEEE Transactions on Vehicular Technology, Sep. 2000, pp. 1986-1994, vol. 49, No. 5, IEEE.

Bourdopoulos, G. et al., "Delta-Sigma Modulators: Modeling, Design and Applications", Sep. 1, 2003, reprinted 2006, pp. 1-20, Imperial College Press, London, UK.

Choi, J. et al., A ΔΣ-Digitized Polar RF Transmitter, IEEE Transactions on Microwave Theory and Techniques, Dec. 1, 2007, pp. 2679-2690, vol. 55, No. 12, IEEE.

Daniel M. Dobkin. "RF Engineering for Wireless Networks: Hardware, Antennas, and Propagation." 2005, pp. 109-113, Elsevier, Inc., London UK.

Silver et al. "The 2011 ARRL Handbook for Radio Communications." Oct. 2010, pp. 10.9-10.11, 88th Edition, ARRL, Newington, CT.

Walid K. M. Ahmed; "Quantization Noise Suppression in Digitally Segmented Amplifiers"; IEEE Transaction on Circuits and Systems; Mar. 2009; pp. 529-540; vol. 56, No. 3; XP11333398A.

* cited by examiner

TRANSMITTER WITH QUANTIZATION NOISE COMPENSATION

RELATED APPLICATIONS

The present application is a continuation of U.S. patent application Ser. No. 13/899,757, filed 22 May 2013, which is a continuation of U.S. patent application Ser. No. 13/320,372, filed 14 Nov. 2011, now U.S. Pat. No. 8,472,557, which is a U.S. National Stage Application (35 U.S.C. §371 Application) of International Application No. PCT/SE2009/050552, filed 18 May 2009, the disclosures of which are incorporated herein by reference.

TECHNICAL FIELD

The present invention discloses a transmitter with an increased degree of efficiency.

BACKGROUND

A transmitter will normally comprise at least one amplifier, the efficiency of which can be enhanced by means of pulsed modulation, i.e. mapping of the modulated communication signal to the characteristics of a pulse train, such as, for example, duration, position or density. In such a transmitter, the pulses are used as input to the amplifier. The purpose of driving the amplifier with a pulse train is to make the amplifier operate more of the time at its high efficiency operating points. By using a pulse train, the power amplifier is only operated in one of two highly efficient regions; deep compression or completely off.

However, pulse modulation schemes such as the one described above will introduce undesired signal distortion caused by quantization noise when generating the pulses, which needs to be handled by means of a bandpass filter, a so called reconstruction filter. Due to the nature of the quantization noise, narrowband filters are needed in order to reconstruct the signal before transmitting. These types of filters have a large insertion loss at microwave frequencies, which leads to increased power dissipation in the filter, thus reducing the power efficiency of the transmitter.

Document WO 2006/110590 discloses a power control module which receives a dynamic power control signal, and generates a differential bias signal which is proportional to the dynamic power control signal.

SUMMARY

As previously described, there exists a need for a solution which can suppress quantization noise in a transmitter which uses pulses as input to an amplifier in the transmitter. In particular, the solution should be able to suppress such noise in or around a Radio Frequent, RF, carrier, since that is where the noise can cause the most "damage".

Such a solution is disclosed by means of the present solution in that it discloses a transmitter which includes a pulse encoder for creating pulses from the amplitude of an input signal to the transmitter, a compensation signal generator for cancelling quantization noise caused by the pulse encoder, a mixer or an I/Q modulator for mixing an output of the pulse encoder with the phase of an input signal to the transmitter, and an amplifier for creating an output signal from the transmitter.

In the transmitter of the invention, a control signal for controlling a function of the amplifier comprises an output signal from the compensation signal generator, and an input signal to the amplifier comprises an output from said mixer or I/Q modulator.

In the transmitter, a control signal for controlling a function of the amplifier comprises an output signal from the compensation signal generator, and an input signal to the amplifier comprises an output from the said mixer or I/Q modulator having been modulated to a desired frequency. The transmitter additionally comprises a band pass filter at the output of the amplifier. In the transmitter, the control signal is at each instant chosen such that the output of the amplifier with the compensation filter is a linear copy of the input signal to the transmitter. The function in the amplifier which the control signal is used for controlling being the maximum output amplitude of the amplifier or the impedance of an output matching network comprised in the amplifier.

As will be shown in the following detailed description, the transmitter of the invention is advantageous when it comes to reducing quantization noise from the pulse encoder.

In one embodiment, the function in the amplifier which the control signal is used for controlling is maximum output amplitude of the amplifier, so called "amplitude modulation". In one embodiment, the function in the amplifier which the control signal is used for controlling is the impedance of an output matching network comprised in the amplifier, so called "load modulation".

In one embodiment, the transmitter of the invention additionally comprises a delay circuit for delaying the output of the mixer before it is used as input to the amplifier, in order to compensate for delays in the compensation signal generator.

In one embodiment, the transmitter of the invention additionally comprises a digital to analogue converter connected at the output of the delay circuit.

BRIEF DESCRIPTION OF THE DRAWINGS

The invention will be described in more detail in the following, with reference to the appended drawings, in which.

DETAILED DESCRIPTION

Figure 1:
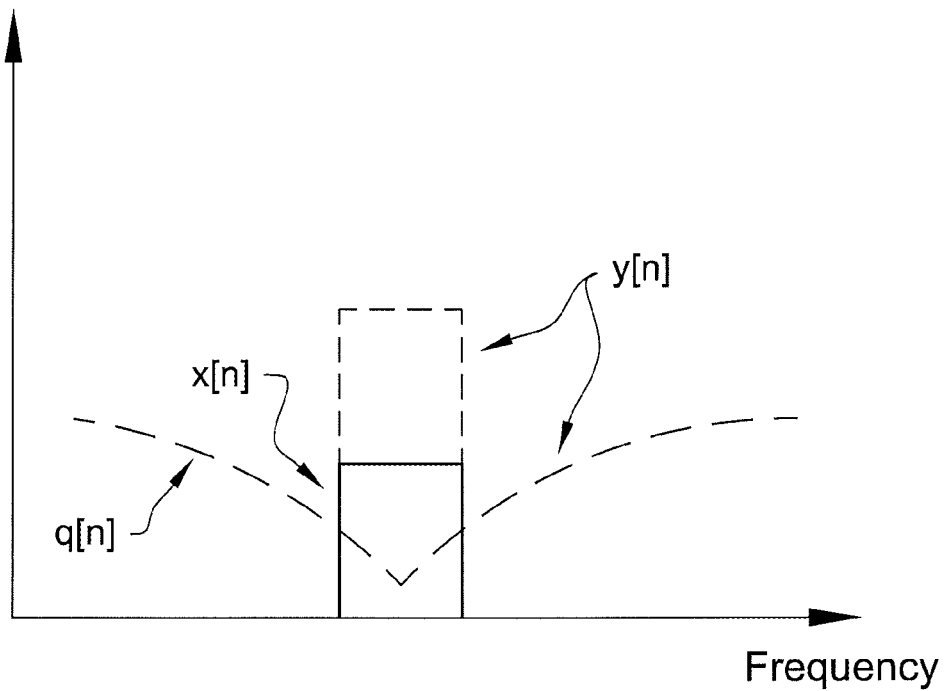
FIG. 1 shows a problem which is addressed by means of the invention.

FIG. 1 shows a problem which is addressed by means of the invention: a signal x[n], for example in the form of an analogue signal, which can be written as $x[n]=A[n]*e^{j\varphi(n)}$, is used as input signal to a transmitter which comprises an amplifier, usually a power amplifier.

Prior to being used as input to the amplifier in the transmitter, the amplitude component A[n] of the input signal x[n], is passed through a pulse encoder which "maps" the signal onto an N-bit representation (or in a general case to some discrete signal levels) in order to use the power amplifier more efficiently. The N-bit representation is usually a 1-bit representation, and creates pulses as the output from the pulse encoder.

However, the pulse encoder also introduces an error term, commonly labelled as quantization noise, which, in the frequency domain, is primarily centred around the RF-carrier about to be transmitted.

The input signal to the transmitter, $x[n]=A[n]*e(n)^{j\Phi(n)}$, is shown as $x[n]$ in FIG. 1, and the output signal from the amplifier is shown as $y[n]$ in FIG. 1. As can clearly be seen in FIG. 1, the output also comprises quantization noise, shown as $q[n]$, centred around the output frequency, so that the output signal can be written as $(A[n]+q[n])*e^{j\Phi(n)}$.

Figure 2:
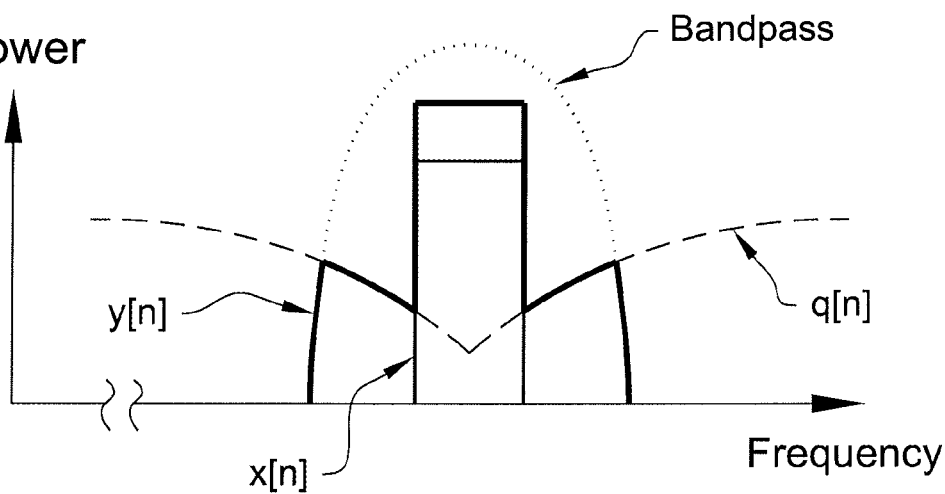
FIG. 2 shows a prior art solution to the problem.

In FIG. 2, a prior art solution for reducing the quantization noise $q[n]$ is indicated: a bandpass filter, the characteristic of which is shown as "Bandpass" in FIG. 2, can be applied at the output of the amplifier, which will result in an output signal $y[n]$ which is shown in FIG. 2. However, as is also evident from FIG. 2, a residue $q[n]$ of the quantization noise will still remain in the filtered output signal, since a bandpass filter will not be able to have a filter characteristic which is sufficiently narrowband to remove all of the quantization noise, particularly not the quantization noise which is in the immediate vicinity of the desired signal, i.e. the modulated RF-carrier.

Thus, as also stated previously, it is an objective of the invention to obtain a solution to the problem of quantization noise in the output signal of a transmitter with an amplifier which has a pulse-train as its input signal.

In the following, the invention will be described by means of three embodiments of transmitters.

Figure 3:
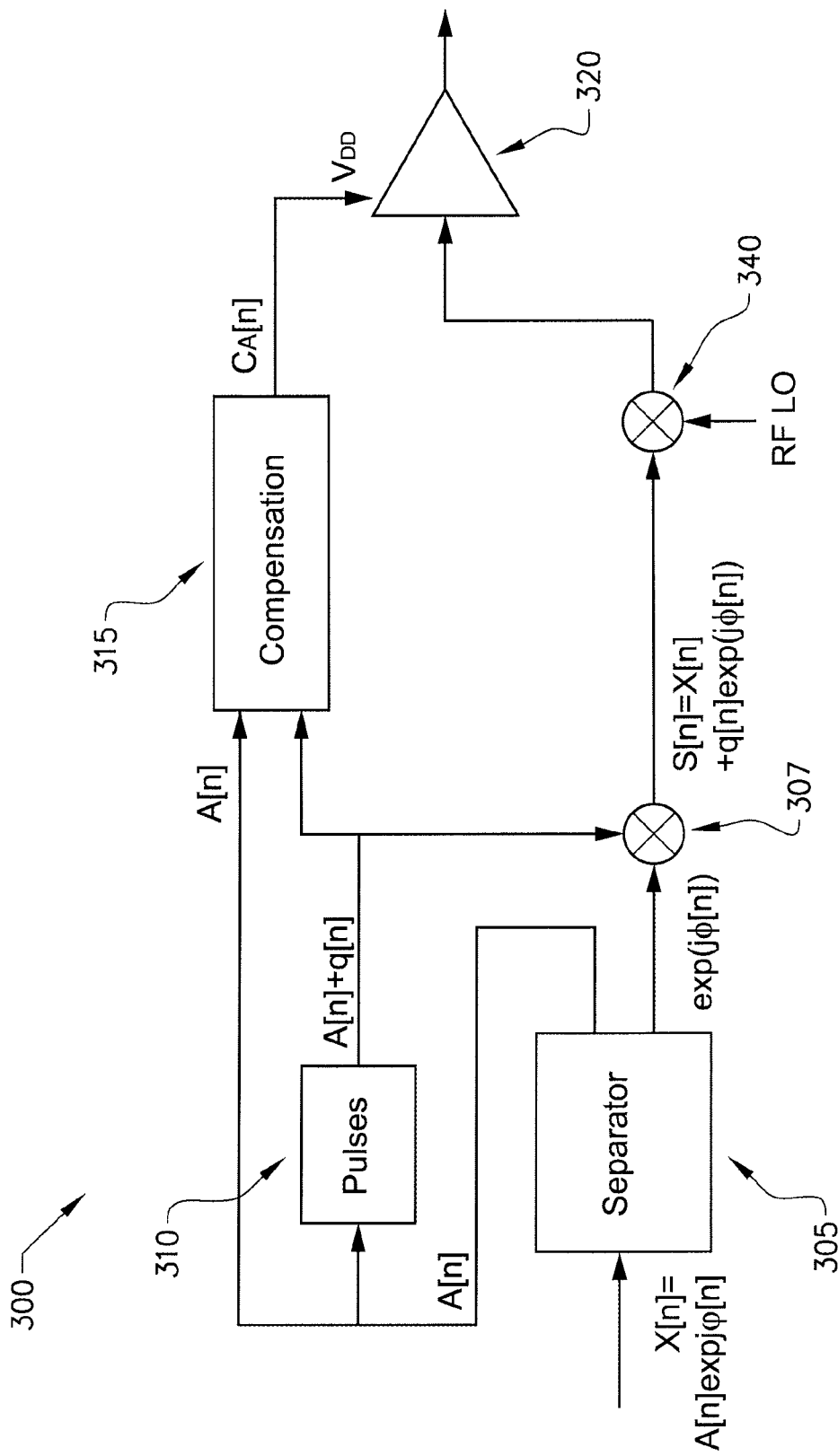
FIG. 3 shows a first embodiment of the invention.

FIG. 3 shows a first embodiment 300 of a transmitter which is based on the principles of the invention. The transmitter 300 is arranged to receive a complex-valued input signal, here denoted as $x[n]=A[n]*e^{j\Phi(n)}$. The input signal is arranged to be fed to a signal component separator 305 which separates the complex valued input signal into phase and amplitude components. The amplitude component is denoted $A[n]$ and the phase component is denoted as $e^{j\Phi(n)}$ or $\exp(j\phi[n])$.

The signal separator 305 delivers said amplitude component $A[n]$ to a pulse encoder 310, i.e. a component which generates pulses as its output in response to the amplitude of the input signal $A[n]$. As mentioned previously, the pulse encoder 310 will also generate signal distortion in the form of so called quantization noise, so that the output signal from the encoder 310 can be written as $A[n]+q[n]$, where $q[n]$ represents the quantization noise.

The output signal $A[n]+q[n]$ from the pulse encoder 310 is mixed with the phase signal $e^{j\Phi(n)}$ from the signal component separator 305 in a mixer 307, so that the output from the mixer 307, here denoted as $S[n]$, can be written as $S[n]=(A[n]+q[n])*e^{j\Phi(n)}$, which can also be written as $X[n]+q[n]*e^{j\Phi(n)}$. The signal $S[n]$ is then mixed in a mixer 340 with a radio frequency signal, an RF carrier, from a local oscillator, an LO, (not shown in FIG. 3), in order to modulate the signal $z[n]$ to a desired RF frequency. In some embodiments, the mixer 307 can be replaced by a so called I/Q-modulator.

The modulated signal is then used as input to an amplifier 320, in order to amplify the output signal from the transmitter to a desired level. Thus, the input signal to the amplifier 320 comprises an output from the mixer 307 which has been modulated to a desired frequency. This is also the case for the other embodiments of the transmitter of the invention which will be described in this text.

According to the invention, and as shown in FIG. 3, the amplifier 320 in the transmitter circuit 300 is arranged to receive as a control signal, $C_A$, the output signal from a compensation signal generator 315. The control signal $C_A$ controls a function of the amplifier, in this case the amplification of the amplifier 320, by means of controlling the maximum output signal amplitude of said amplifier. This can also be expressed by saying that since the input signal to the amplifier is either on or off due to the use of the pulse encoder, the resulting amplifier output amplitude for the "on-state" is governed by the control signal $C_A$.

Turning now to a more detailed description of the compensation signal generator 315, the input to this component in the embodiment of the invention shown in FIG. 3 is two signals, one of which is the amplitude signal $A[n]$ from the signal component separator 305, and the other is the output signal from the pulse encoder 310, i.e. $A[n]+q[n]$.

In other words, one of the input signals to the compensation signal generator 315 is the "pure" amplitude signal $A[n]$, and the other input signal is the output from the pulse encoder 310, i.e. $A[n]+q[n]$. As explained previously, the output from the compensation signal generator 315, here denoted as $C_A[n]$, is used as control signal to the amplifier 320. Thus, the output signal from the compensation signal generator 315 is used to control a function of the amplifier 320, in this case the amplification of the modulated input signal to the amplifier 320.

A more exact description of the nature and function of the compensation signal generator 315 is as follows: the compensation signal $C_A$ should at every instant be chosen such that the output signal of the amplifier is a linear copy of the input signal to the transmitter taking the reconstruction filter into consideration. This can be expressed as:

$$A[n]e^{j\phi[n]}=\sum_{k=0}^{L}f[k-n]\cdot C_A[n]\cdot(A[n]+q[n])e^{j\phi[n]} \quad (1)$$

where $f[k-n]$ is the impulse response from a filter used at the output of the transmitter, a so called reconstruction filter.

The invention's use of the output signal from the compensation signal generator 315 as control signal to the amplifier 320 is advantageous since an extra degree of freedom is introduced in obtaining the final output signal given a reconstruction filter, which will make it possible to maximize the power efficiency of the transmitter. The RF input signal to the amplifier can be maintained in a so called "deep saturation mode", thereby ensuring optimum efficiency, while the control signal to the amplifier will set the correct signal level at the output of the amplifier.

Figure 4:
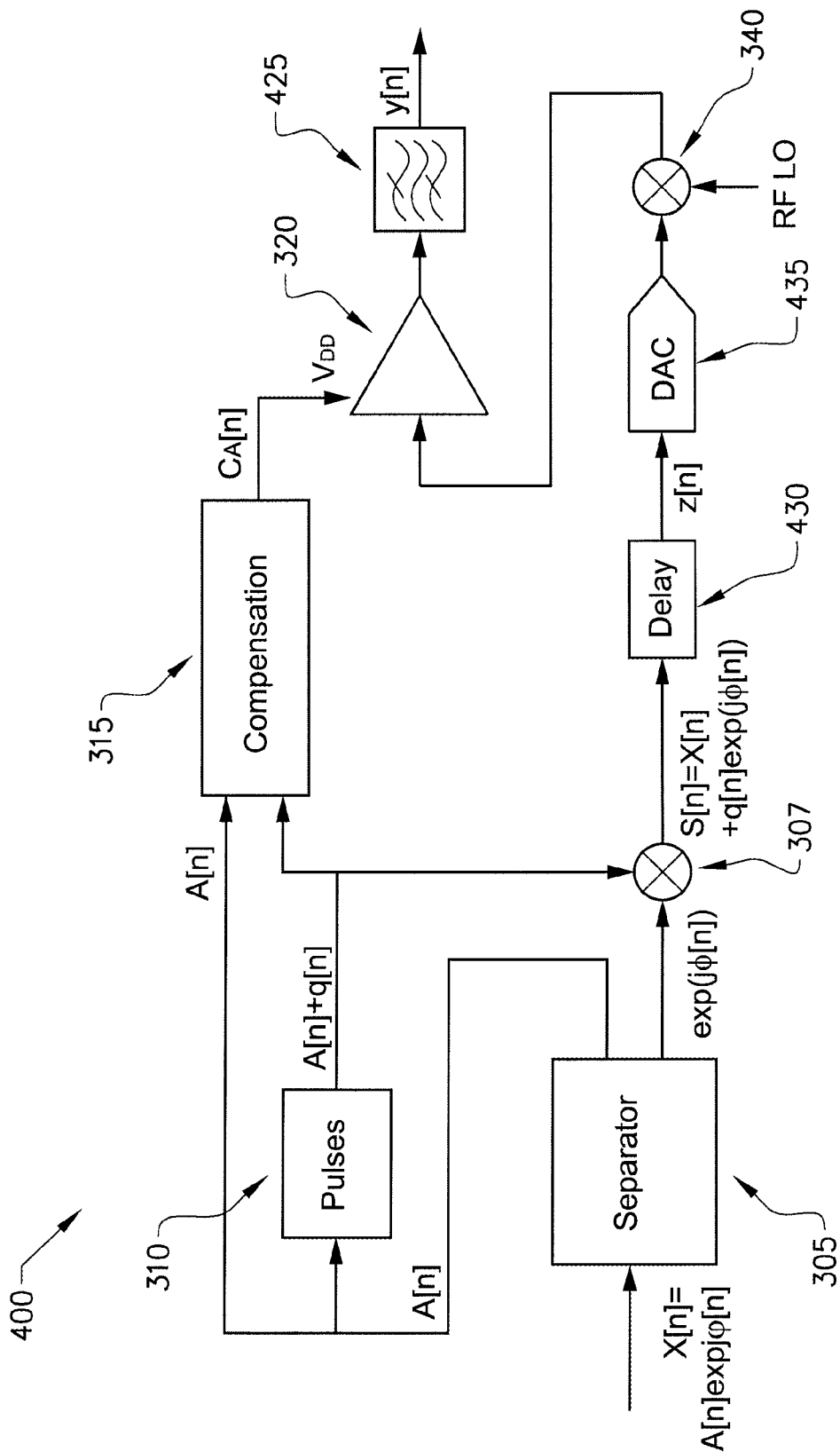
FIG. 4 shows a second embodiment of the invention.

FIG. 4 shows a second embodiment 400 of a transmitter of the invention. Components which have the same basic function as in embodiment 300 in FIG. 3 have retained their reference numbers from FIG. 3.

Apart from the components of the transmitter 300 of FIG. 3, the transmitter 400 shown in FIG. 4 comprises a delay circuit 430, in order ensure that the signal which is used as input to the amplifier 320 is "synchronized with" the signal which is used to control the amplifier 320. Thus, the delay of the delay circuit 430 should suitably correspond to the "processing time" of the compensation signal generator 315, i.e. the delay introduced by the compensation signal generator 315.

The output of the delay circuit, in FIG. 4 denoted as $z[n]$, is put through a digital to analogue converter DAC 335, and is then mixed in the mixer 340 with a Radio Frequency signal, an RF signal, from a Local Oscillator, an LO, (not shown in FIG. 4), in order to modulate the signal $z[n]$ to a desired RF frequency.

As shown in FIG. 4, the transmitter circuit 400 in this embodiment comprises a bandpass filter 425, a so called reconstruction filter as mentioned above, at the output of the amplifier 320, in order to remove undesired components in the output signal of the amplifier.

Figure 5:
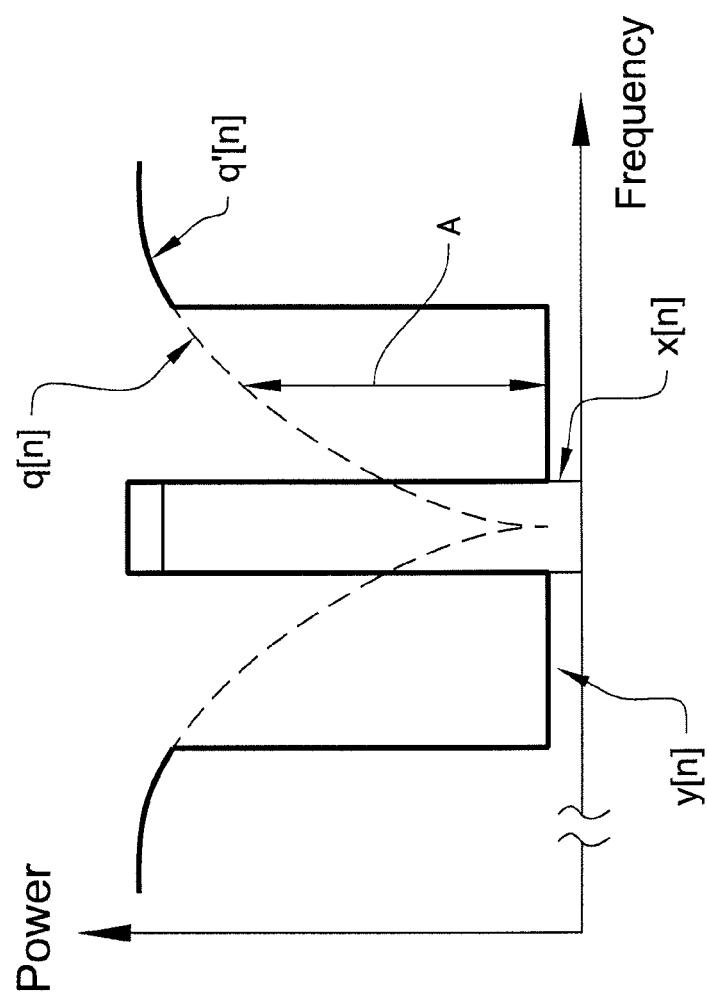
FIG. 5 shows a result obtained by means of the invention.

FIG. 5 shows a result obtained by means of the invention: the input signal $x[n]$ to the circuit 400 of FIG. 4 is shown in FIG. 5, as well as the output signal $y[n]$ from the circuit 400.

As can be seen, the output signal y[n] has a significantly reduced content of quantization noise, q[n], which, as a reference, is also shown in FIG. 5 by means of dashed lines. Thus, the invention reduces the quantization noise in the output signal in a sharp area around the "desired" output signal x[n], which is a clear improvement as compared to the solution with a narrow bandpass filter at the output of the circuit. Remaining quantization noise is shown as q'[n], and as can be seen, q'[n] is located outside of the spectrum of the output signal y[n].

The suppression obtained of the quantization noise by means of the invention is also shown in FIG. 5 by an arrow "A", and as mentioned, the "out of band" quantization noise in the output signal is shown in FIG. 5 as q'[n].

Figure 6:
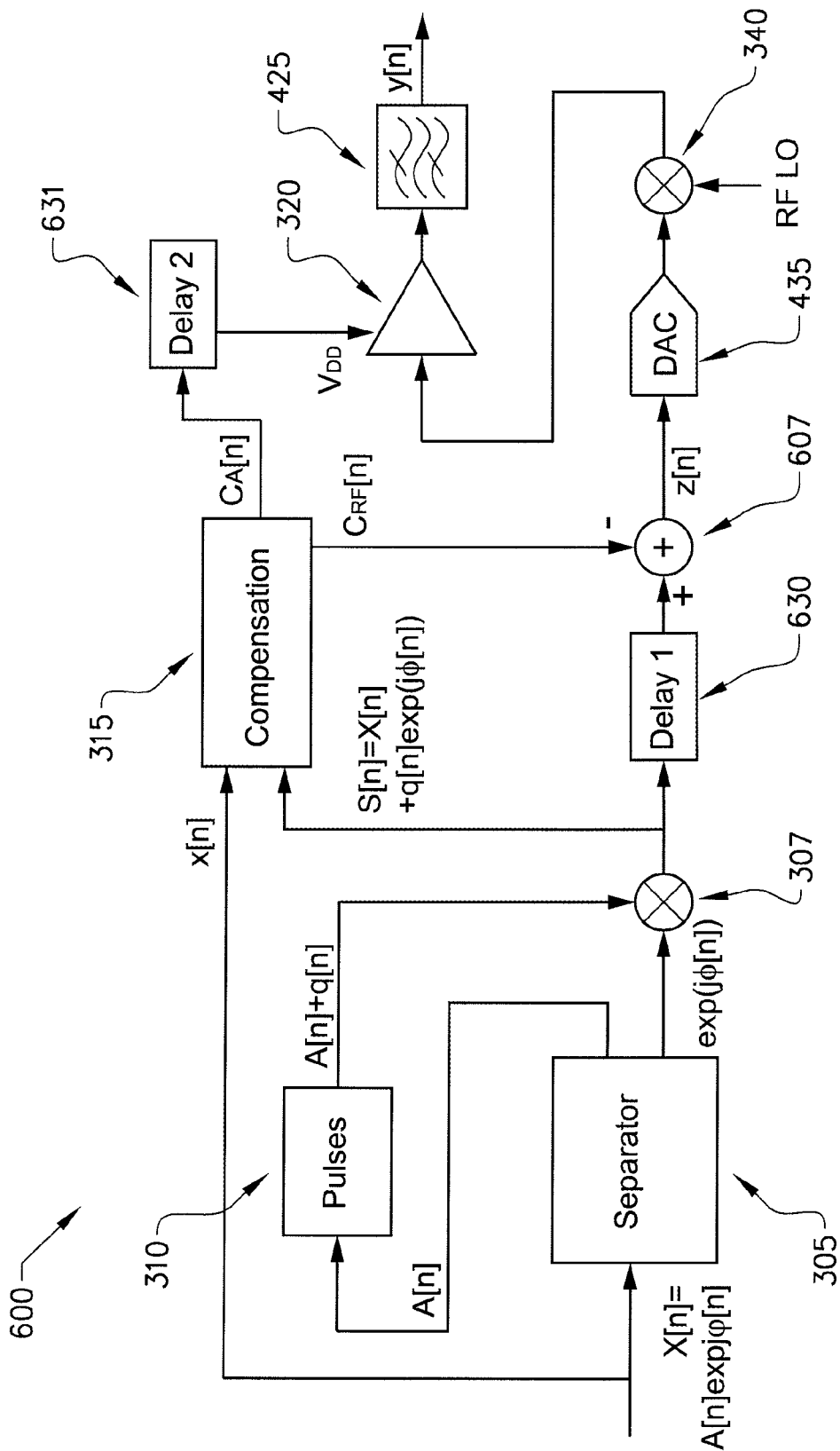
FIG. 6 shows a third embodiment of the invention.

FIG. 6 shows a further example of an embodiment of the invention. Components which have the same basic function as those in the embodiments 300 in FIGS. 3 and 400 in FIG. 4 have retained their reference numbers, and as can be seen from FIG. 6, the embodiment 600 is in many ways similar to the embodiments 300 and 400 of FIGS. 3 and 4. Thus, the embodiment 600 comprises a signal component separator 305, a pulse encoder 310, an amplifier 320 and a compensation signal generator 315, the output, $C_A$, of which is used as a control signal to the amplifier 320.

The compensation signal generator 315 of the embodiment 600 has two input signals, one of which is the input signal x[n] and the other of which is the output from the mixer 307, again denoted as S[n]. Thus, the two input signals to the compensation signal generator 315 in FIG. 5 are x[n] and $S[n]=x[n]+q[n]*e^{j\Phi(n)}$. The use of the input signal x[n] as one of the input signals to the compensation signal generator 315 is achieved by means of "splitting" the input signal x[n] before the component separator 305, so that one "branch" of x[n] is connected to the compensation signal generator 315, and the other "branch" of x[n] is used as input signal to the signal component separator 305.

The output S[n] from the mixer 307 is, in the embodiment of FIG. 5, also split, so that one "branch" of S[n] is used as input to the compensation signal generator 315, as mentioned above, and one "branch" of S[n] is used as input to a first delay circuit 630.

As opposed to the embodiments shown and described previously, the compensation signal generator 315 of the embodiment 600 produces both a first and a second compensation signal, here denoted as $C_A[n]$ and $C_{RF}[n]$. The first compensation signal, $C_A[n]$, is used as a control signal to the amplifier 320, after having been passed through a second delay circuit 631. The second delay circuit 631 serves to align (in time) the input signals to the different components.

The output from the first delay circuit 630 is added to the second compensation signal from the circuit 315, $C_{RF}[n]$ in an adder 607, with the sum output from the adder 607, denoted in FIG. 6 as z', being passed through a digital to analogue converter 435, following which it is arranged to be modulated by an external LO to a desired RF frequency, and then used as input signal to the amplifier 320. The purpose of the second compensation signal $C_{RF}$ is to create further possibilities to fine tune the efficiency of the circuit 600, corresponding to a certain output signal from the amplifier.

The combination of the compensation signals $C_A$ and $C_{RF}$ should be chosen as follows:

$$A=[n]e^{j\phi[n]}=\Sum_{k=0}^{L} f[k-n] \cdot C_A[n] \cdot (A[n]+q[n]-C_{RF}[n]) \cdot e^{j\phi[n]} \quad (2)$$

The invention is not limited to the examples of embodiments described above and shown in the drawings, but may be freely varied within the scope of the appended claims. For example, the control signal $C_A[n]$ can also, instead of being used as a means of controlling the output amplitude of the amplifier by means of supply modulation, be used for controlling the impedance of the an output matching network of the amplifier in the transmitter, which is referred to as "load modulation". In such an embodiment, the matching network is suitably comprised in the amplifier.

What is claimed is:

1. A transmitter comprising:
   a pulse encoder for producing pulses from the amplitude of a complex input signal to the transmitter;
   a compensation signal generator operatively coupled to the pulse encoder configured to cancel quantization noise caused by the pulse encoder to generate a first control signal;
   a first mixer or I/O modulator operatively coupled to the pulse encoder for mixing an output of the pulse encoder with the phase of the complex input signal to the transmitter, said output of the pulse encoder comprising the amplitude of the complex input signal plus the quantization noise caused by the pulse encoder;
   a second mixer operatively coupled to the first mixer or I/O modulator for converting an output from the first mixer or I/O modulator to a desired frequency;
   an amplifier operatively coupled to the compensation signal generator and the second mixer and configured to provide an amplified signal; and
   a band pass filter operatively coupled to an output of the amplifier,
   wherein the first control signal is configured by the compensation signal generator to control a maximum output amplitude of the amplifier or an impedance of an output matching network comprised in the amplifier such that the output of the band pass filter comprises a linear copy of the complex input signal to the transmitter, and
   wherein a first input signal to the compensation signal generator comprises the complex input signal to the transmitter and a second input signal to the compensation signal generator comprises the pulses produced in the pulse encoder inclusive of the quantization noise caused by the pulse generator multiplied with the phase part of the complex input signal.

2. The transmitter of claim 1, further comprising a delay circuit operatively coupled to the first mixer or I/Q modulator for delaying the output of the first mixer or I/Q modulator to compensate for delays introduced by the compensation signal generator.

3. The transmitter of claim 2, further comprising a digital-to-analog converter operatively coupled to an output of said delay circuit.

4. The transmitter of claim 1, wherein the first input signal to the compensation signal generator comprises the amplitude part of the complex input signal to the transmitter.

5. The transmitter of claim 1, wherein the compensation signal generator has two inputs used in performing canceling quantization noise.

6. The transmitter of claim 1, wherein the amplitude of the complex input signal is indicated by the heights of the pulses output by the pulse encoder.

* * * * *